United States Patent [19]

Bol

[11] 4,338,616
[45] Jul. 6, 1982

[54] SELF-ALIGNED SCHOTTKY METAL SEMI-CONDUCTOR FIELD EFFECT TRANSISTOR WITH BURIED SOURCE AND DRAIN

[75] Inventor: Izya Bol, Hawthorne, Calif.

[73] Assignee: Xerox Corporation, Stamford, Conn.

[21] Appl. No.: 122,627

[22] Filed: Feb. 19, 1980

[51] Int. Cl.³ ........................................... H01L 21/265
[52] U.S. Cl. ...................................... 357/15; 357/22
[58] Field of Search ..................................... 357/15, 22

[56] References Cited

U.S. PATENT DOCUMENTS 3,668,481  6/1972  Saltich et al. ........................ 357/15
4,128,439  12/1978  Jambotkar ............................ 357/23
4,263,605  4/1981  Christou et al. ...................... 357/22

FOREIGN PATENT DOCUMENTS 2824026  12/1979  Fed. Rep. of Germany ........ 357/22

OTHER PUBLICATIONS

Field, R. K., "Pico-Second Diode Takes a 450 Volt Jolt", Electronic Design, 25 Oct. 1967, pp. 40, 42.

Primary Examiner—R. A. Rosenberger

[57] ABSTRACT

A semi-conductor structure and particularly a high speed VLSI Self-Aligned Schottky Metal Semi-Conductor Field Effect Transistor with buried source and drain, fabricated by the ion implantation of source and drain areas at a predetermined range of depths followed by very localized laser annealing to electrically reactivate the amorphous buried source and drain areas thereby providing effective vertical separation of the channel from the buried source and drain respectively. Accordingly, spatial separations between the self-aligned gate-to-drain, and gate-to-source can be relatively very closely controlled by varying the doping intensity and duration of the implantation thereby reducing the series resistance and increasing the operating speed.

3 Claims, 8 Drawing Figures

SELF-ALIGNED SCHOTTKY METAL SEMI-CONDUCTOR FIELD EFFECT TRANSISTOR WITH BURIED SOURCE AND DRAIN

CROSS-REFERENCE TO A RELATED APPLICATION

An application entitled "Application of Grown Oxide Bumper Insulator to a High Speed VLSI SASMESFET" bearing U.S. Ser. No. 121,622 and filed on Feb. 14, 1980 by the present inventor and Keming Yeh which is assigned to the same assignee as the present patent application, discloses and claims an invention with spatial drain-to-gate and source-to-gate separations in the X-coordinate.

BACKGROUND OF THE INVENTION

1. Field of the Invention

The present invention relates to the structure and process for fabricating semi-conductor devices and particularly Self-Aligned Schottky Metal Semi-Conductor Field Effect Transistors with buried source and drains (SASMESFETBUS) in the Y-coordinate.

2. Prior Art

In the past, SASMESFET's were accomplished by an etching step that defined source-drain-gate separations as described in the IEEE proceedings, Vol. 59, pp. 1244-5, August 1971, or facet-growth where epitaxial growth defined the channel as described in the U.S. Pat. No. 3,943,622, March 1976. Both of the above, even with the use of self-aligning as is the former, use processes that are relatively difficult to control thus structure geometries approaching anything like VLSI cannot be very small without sacrificing yield. Thus, the operating frequency is not as high, and series resistance is not as relatively low as might be desired. As such, there existed a need for a high-speed SASMESFET structure and process therefor that was process controllable at the desired relatively high operating frequency and low series resistance, yet have a reasonable yield in mass quantities.

U.S. Pat. No. 4,128,439 described a process for a MOSFET having buried source and drain. It will be appreciated that this is a MOSFET with no Schottky gate. Although ion implantation is used, subsequent electrical activation is provided by out-diffusion via thermal annealing which spreads the ion implanted area until it actually contacts the gate. It will be appreciated that since spatial spacings here are not critical, relatively imprecise thermal annealing may be used.

SUMMARY OF THE INVENTION

It is thus an important object of the invention to provide a high-speed VLSI Self-Aligned Schottky Metal Semi-Conductor Field Effect Transistor having a relatively high operating frequency and low series resistance.

It is a further important object of the invention to provide a high-speed Self-Aligned Schottky Metal Semi-Conductor Field Effect Transistor having relatively small structure geometries that are minimal as to gate length, and gate-to-source and gate-to-drain spatial separations in the Y-Coordinate that are process controllable in relatively large quantities at high yields.

It is yet another important object of the invention to provide ion implanted buried source and drain areas in the substrate of the SASMESFETBUS thereby allowing relatively small structure geometries without causing short-circuiting or unduly high series resistance between the gate and buried source and drain areas.

It is yet another further important object of the invention to provide a strictly controllable means of varying the space separations as between the source-to-gate and drain-to-gate by laser annealing the ion implanted buried source and drain area to restore the damaged crystalline-material therein thereby electrically reactivating the areas for precisely controlling the minimal vertical distance between the Schottky gate and the buried source and drain areas.

BRIEF DESCRIPTION OF THE DRAWINGS

Various other objects, advantages and meritorious features of the invention will become more fully apparent from the following specification, appended claims and accompanying drawing sheets.

The features of a specific embodiment of the invention are illustrated in the drawings, in which.

BRIEF DESCRIPTION OF THE PREFERRED EMBODIMENT

Figure 1:
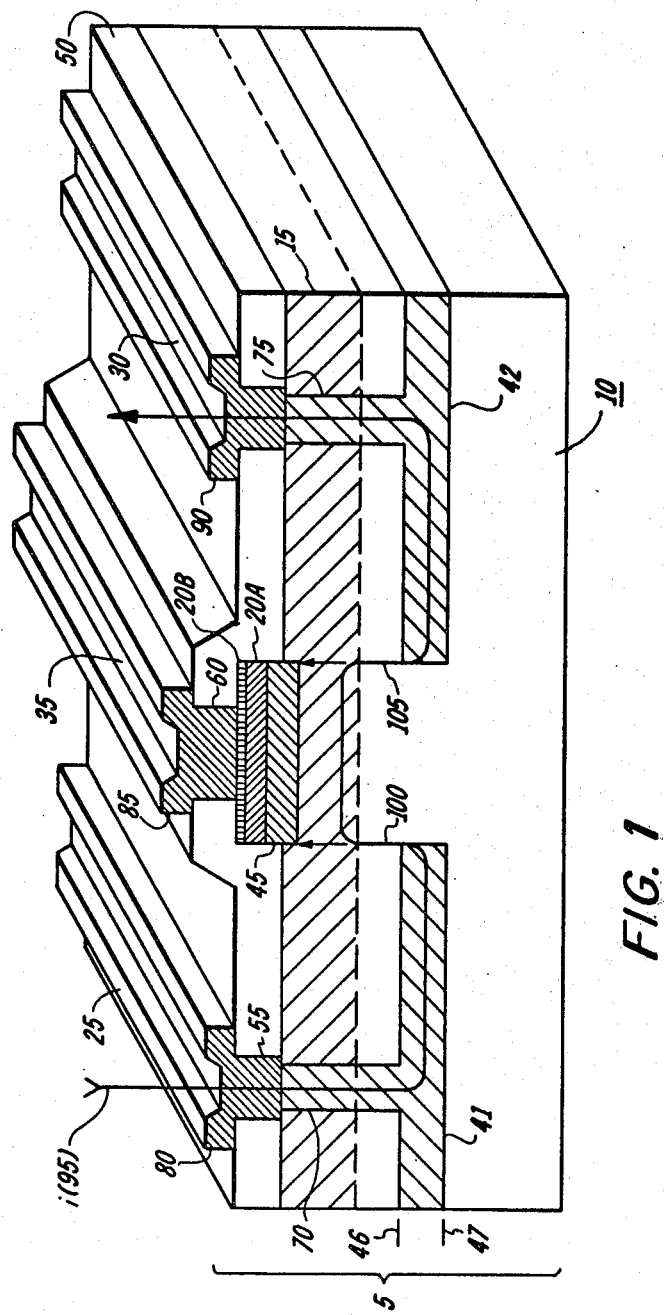
FIG. 1 is a perspective profile view of the SASMESFETBUS structure of the invention.

Referring to FIGS. 1 through 3F by the characters of reference, there is illustrated an apparatus for carrying out the objects of the invention. In the preferred embodiment of the invention as shown in perspective profile FIG. 1 and expanded profile FIG. 2 a view of a high speed VLSI Self-Aligned Schottky Metal Semi-Conductor Field Effect Transistor with buried source and drain (SASMESFETBUS) structure 5. It is also known as a Self-Aligning Gate Metal Semi-Conductor Field Effect Transistor with buried source and drain (SAG-MESFETBUS) structure 5. The structure is formed on a substrate 10 which in this embodiment is a semi-conducting silicon substrate that is relatively slightly p doped with boron. Source and drain areas 41, 42 have been formed by heavy ion implantation (with phosphorous) with the peak concentration located around 4000 plus or minus 500 angstroms (46, 47). The buried source and drain areas 41, 42 have been laser annealed to electrically reactivate the ion implant damage therein. It will be appreciated that the ends 43, 44 of the buried source and drain 41, 42 are coincident with the ends 48, 49 of the Schottky barrier 45, which defines the Y-coordinate distances 100, 105 respectfully and the current path i (95).

A channel area 15 to a depth of 1500 angstroms in the surface of the silicon substrate has been ion implanted (arsenic) to a predetermined depth. Although the substrate is silicon in this embodiment, it may be any semiconductor or epitaxial material. Relatively heavily N+ ion implantation (with phosphorous) and laser annealing as supra, have been made to high conductive areas 70, 75 to electrically connect the windows 55, 65 of the source and drain areas 25 30 to their buried source and drain areas 41, 42 respectively. An insulator layer 50 PVX has been completely deposited over the top surface of the silicon substrate 10 at a predetermined thickness with the exception of the source, drain and gate windows 55, 60, 65. A Schottky barrier has been formed in the gate area 35 by thermal alloying to create a layer 45 of Platinum-substrate or silicide alloy over and in operative contact with the top surface of the channel 15 in the silicon substrate 10 down to a predetermined level below the surface of the substrate 10. Over the barrier layer 45 is disposed thereon a layer 20A of unalloyed or unreacted platinum. Over the unalloyed layer 20A is disposed a deposited layer 20B of Titanium-Tungsten (TiW). Over and disposed in the windows 55, 60, 65 for the source, drain and gate areas 25, 30, 35 are aluminum metalizing interconnection layers 80, 85, 90 respectively for ohmic contacts and Schottky barrier for the structure 5. The current (i) 95 flows from the metalizing layer 80 through the high conducting area 70 through the buried source 41, up across the channel area 15, down across the buried drain area 42, up the high conductive area 75, and up through the metalizing layer 90. As shown in an expanded profile view in FIG. 2, it will be appreciated that the distance 100 of 2500 angstroms or less from the top of the buried source 41 to the bottom of the channel 15 is critical for the speed VLSI structure 5 in that the shorter the distances 100, 105, the less the series resistance (also effected by doping concentrations in buried source and drain areas 41 and 42) and thus the higher the operating frequency or device speed according to the equation maximum frequency equals maximum transconductance divided by gate capacitance times the quantity one plus series resistance times maximum transconductance). Because the distances 100, 105 can be very precisely controlled using the infra processes, they can be relatively short compared to the prior art without an appreciatible risk of short circuiting thus making relatively high yields realizable.

Advantages of the Schottky Self-Aligned Gate Metal Semi-Conductor Field Effect Transistor (SASMESFET) structure 5 in areas where high speed applications are required are well known. High speed applications of the structure 5 require very small geometries, so gate length 110 as well as source to gate and gate to drain spaces 100, 105 should be minimized. At the same time, source to gate and gate to drain spatial separations 100, 105 should be sufficient enough to prevent low voltage (LV) breakdown or short circuiting (SC). Because of supra requirement, a self-aligned structure 5 seemed to be most suitable.

Self-Aligned Schottky Gate Field Effect Transistors are accomplished by different methods which use either an etching step, see proceedings of the IEEE Vol. 59, pp. 1244–5, August 1971, or facet-growth, see U.S. Pat. No. 3,943,622, March 1976. Both of the supra use processes which are relatively very difficult to control at narrow separations yet still have high yields. In the first one, it is the etching step that defined source-gate-drain separations. In the second one, it is the epitaxial growth that defines the channel. A Self-Aligned Field Effect Transistor can also be made by the method suggested in the cross-referenced application titled "Application of grown oxide bumper insulators to a high speed VLSI SASMESFET" by Izya Bol et al U.S. Ser. No. 121,622 and filed on Feb. 14, 1980.

Figure 2:
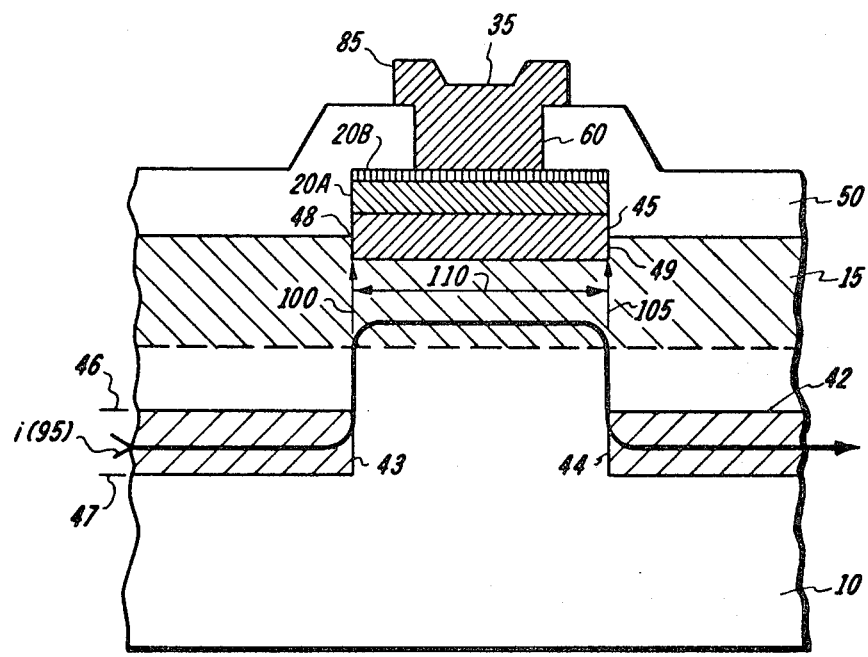
FIG. 2 is an expanded profile view of the Schottky gate and buried source and drain areas of the SASMESFETBUS structure of FIG. 1.

The present invention is aimed at making SASMESFET fabrication processes simpler and to increase the upper frequency limit thereof. In all prior art MESFET devices, source-to-gate and drain-to-gate separations are reached by separations on the surface (X-coordinate) of the substrate of the structure, that is, separation in the horizontal plane. The principal difference of the fabrication process described below is that source to gate and drain to gate separations are in the depth (Y-coordinate) of the substrate of the structure in the vertical plane. Buried source and drain areas 41, 42 are used to obtain the depth or distance separations 100, 105 from the channel 15. Since the depth or separations 100, 105 can be controllably relatively small, the series resistance can also be minimized since it is directly proportional to the supra depth. It is yet another principal difference of the invention that gate metal 45 in this fabrication process is deposited immediately and directly over a semi-conductor substrate 10 and laser annealing is widely used which makes for a relatively simplified fabrication process that can be used to form a high speed VLSI SASMESFEBUS structure 5. It will be noted that the current (i) 95 flows in the structure 5 as shown in FIGS. 1 and 2. It will also be appreciated that the total series resistance (Rs) has two components, mainly the series resistance in the gate (channel)-to-drain distance 100 and the series resistance in the gate (channel)-to-source distance 105. The total series resistance can be made to be relatively very small as explained supra because it is determined by the spacings 100, 105 and doping concentrations in the buried source and drains 41, 42 and channel 15, therefore the upper frequency limit or operating speed will be relatively very high, according to the formula frequency maximum equals maximum transconductance divided by gate capacitance times the quantity one plus series resistance times maximum transconductance.

In the controllable process for fabricating the type of MESFET (Metal-Semi-Conductor Field Effect Transistor) known as a SAGMESFETBUS (Self-Aligning Gate Metal Semi-Conductor Field Effect Transistor with Buried Source and Drain) or Self-Aligned Schottky Metal Semi-Conductor Field Effect Transistor with Buried Source and Drain (SASMESFETBUS) structure 5, there are six major steps in the preferred embodiment. It will be appreciated that either N doped/channel logic (as in the present case) or p doped/-channel logic may be used to obtain the desired result in the present invention. It will be further appreciated the dimension and tolerances used in the present embodiment are exemplary and may be modified within reasonable limits without detracting from the present invention. The infra described major steps are shown in FIGS. 3A through 3F respectively.

Figure 3A:
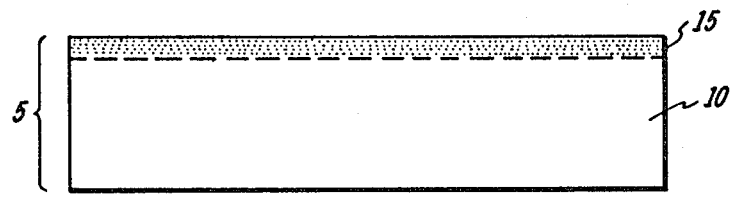
FIG. 3A is a profile view of the channel implantation step one of the processes used to fabricate the SASMESFETBUS structure of FIG. 1.

In the first major process step, as shown in FIG. 3A known as the channel implantation step for the SASMESFETBUS 5. As a first substep, a channel 15 is ion implanted to a predetermined level of 1500 angstroms in the lightly p doped silicon substrate 10. A predetermined amount of arsenic (V=160 KEV, N=2E12 cm$^{-2}$)is used in the ion implant if a gate implant-enhancement is desired as is the case here. A second substep of annealing the channel 15 is performed to activate the implant. Alternatively, an additional predetermined amount of arsenic (V=160 KEV, N=7E 11 cm$^{-2}$) may be ion implanted after being photopatterned with a depletion mask into the desired gate area to get depletion devices where so desired.

Figure 3B:
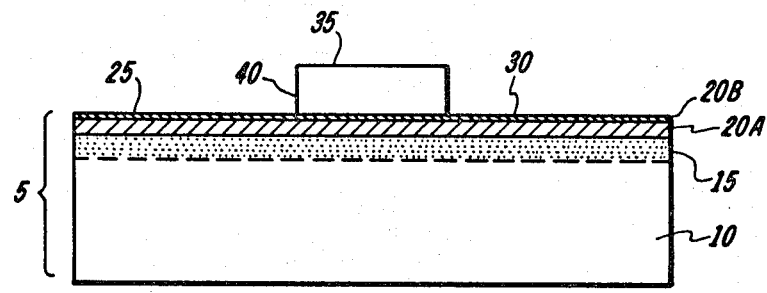
FIG. 3B is a profile view of the proper metal depositing step two of the process used to fabricate the SASMESFETBUS structure of FIG. 1.

In the second major process step as shown in FIG. 3B, known as the proper metal depositing step, for the SASMESFETBUS 5, a first sputtering deposition of a proper metal such as Platinum (Pt), as a first substep, is made as a layer or film 20A to a predetermined depth around 4000 angstroms. The platinum layer 20A is used as shown infra to form a Schottky barrier. A third substep of photopatterning with a Schottky mask is used to define source 25, drain 30 and gate areas 35 where the source and drain areas 25, 30 are exposed down to the silicon substrate 10 level while a positive photoresist layer 40 is temporarily left (not stripped) over the gate area 35 at a predetermined depth adequate not to be worn away in a subsequent etching step.

Figure 3C:
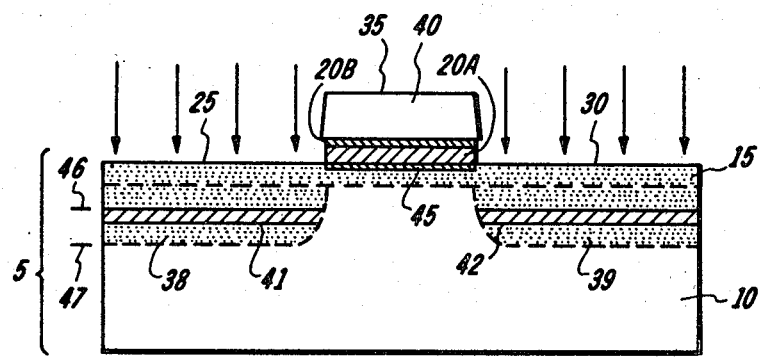
FIG. 3C is a profile view of the proper metal etching step three of the process used to fabricate the SASMESFETBUS structure of FIG. 1.

In the third major process step as shown in FIG. 3C, known as the proper metal etching sep, for the SAS-MESFETBUS 5, as a first substep, the platinum layer 20B is completely etched away with a solution of aqua regia solution at 90 degrees centigrade with the exception of the gate areas 35 protected by photoresist layer 40 whereby the remaining platinum layer 20B will ultimately be used to form a Schottky gate as described infra. In a second substep, the photoresist layer 40 over the defined gate area 35 is completely stripped away. In a third substep, high energy ion implantation with phosphorous (dosage equal $6.0 \times 10^{14}$ and energy equals 400 KEV) is used to implant relatively heavily the buried source and drain areas 41, 42, but not the gate area 35 insomuch as it is relatively protected from ion beam by the platinum layer 20B. It will be appreciated that the buried source and drain areas 41 and 42 represent a predetermined location of maximum implantation of ions that are controllable as to depth as in the present case of between high and low depths of 4000 plus or minus 500 angstroms in depth (46, 47). It will be further appreciated that the energy of ion implantation determine depths 100, 105.

In a fourth substep, laser annealing is used to synchronously scan the surface of silicon substrate 10 including the source, drain and gate areas 25, 30 and 35. It will be appreciated that the platinum layer 20A, acts to retard the radiation of the laser annealing in the gate area 40. Accordingly, the full effect of laser annealing is applied only to the source and drain areas 25, 30 in the SAS-MESFETBUS 5. Insomuch as the ion implantation of the buried source and drain areas 41, 42 of the silicon substrate 10 in the third substep of the third major step act to relatively damage the crystalline structure therein by making it somewhat amphorous thereby electrically deactivating it, some process of annealing is needed to restore the perfection of the crystal thereby electrically reactivating it such as laser annealing. Laser annealing has the advantage of being able to precisely control the application of heat to a very localized area and without the risk of appreciable out-diffusion as in conventional thermal annealing. The laser annealing only acts on the ion implanted areas having at least the predetermined level of implantation which the laser treats as an impurity which it thermally acts on. The advantages of laser annealing, as opposed to prior art conventional thermal annealing, is uniform application, very controllable localized application such as relatively heavily implanted source and drain areas 41 and 42 thereby disallowing heating of the surrounding substrate.

Background references to laser annealing may be had by referring to Appl. Phys. Lett. 32(5), Mar. 1, 1978 at page 276, and Sov. Phy. Semi-Cond., Vol. 10, No. 10, October 1976. It will be further appreciated that laser annealing prevents out-diffusion to a much greater degree than conventional thermal annealing.

In a fifth substep, thermal application at a relatively high temperature is made to the gate area 35, and in particular, the platinum layer 20A to form a level 45 of platinum-substrate or silicide alloy as a Schottky barrier down to a predetermined level below the substrate 10. In an optional sixth substep, the unalloyed portion of the platinum is etched away.

Figure 3D:
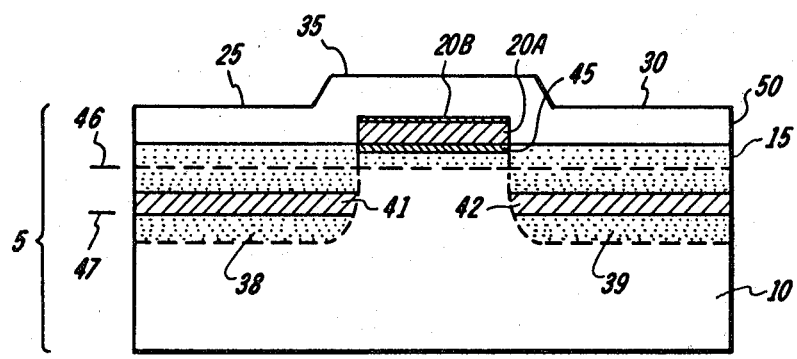
FIG. 3D is a profile view of the insulator depositing step four of the process used to fabricate the SASMESFETBUS structure of FIG. 1.

In the fourth major process step as shown in FIG. 3D known as the insulator depositing step, for the SAS-MESFETBUS 5, deposition of an insulator level 50 such as PVX at a predetermined relative thicknesses of 3000 angstroms plus or minus 500 angstroms as the only substep. It will be appreciated that a relatively low temperature insulator such as PVX must be used where a proper metal such as platinum is used to form the Schottky barrier in the gate area 35. If any other proper metal such as Molybdenum (Mo) is used to form the Schottky barrier from relatively any insulator may be used be it of the low or high temperature type.

Figure 3E:
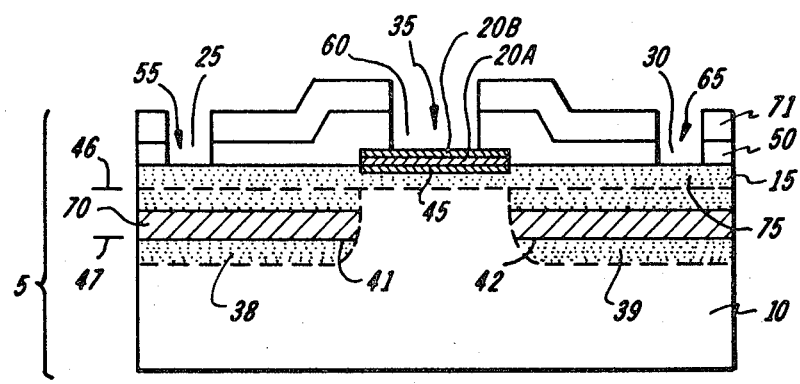
FIG. 3E is a profile view of the contact photopatterning step five of the process used to fabricate SASMESFETBUS structure of FIG. 1.

In the fifth major process step as shown in FIG. 3E, known as the contact photopatterning step, for the SASMESFETBUS 5, photopatterning with a contact mask is used to define the windows 55, 60, 65 with ammonium fluoride etch for the source, drain and gate areas 25, 30 and 35 respectively through the laid down negative photoresist layer 71 as a first substep. As a second substep, the windows 55, 65 are ion implanted with phosphorous (dosage equals 6E 15 1 cm$^{-2}$ and energy equal 100 KEV) to provide high conductive areas 70 and 75 from the surface of the silicon substrate 10 in the source and drain areas 25, 30 to the outer limit of maximum distribution of implanted ions defined at depth 46. As a third step, laser annealing is again used to scan the surface of the silicon substrate 10 to again recrystalize and electrically activate the highly conductive ion implanted areas 70, 75 for the source and drain areas 25, 30 respectively similarly as that described in the fourth substep of the third major process step.

Figure 3F:
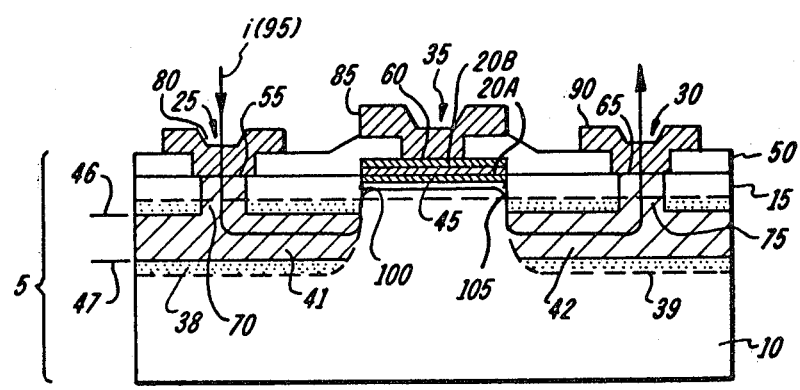
FIG. 3F is a profile view of the contact and interconnection metalizing step six of the process used to fabricate the SASMESFETBUS structure of FIG. 1.

In the sixth major process step as shown in FIG. 3F, known as the contact and inter-connection metalizing step, for the SASMESFETBUS 5, as a first substep, the photoresist layer 71 is stripped away. As a second substep, successive metallic layers of Titanium-Tungsten and then aluminum are deposited to a thicknes of 9000 angstroms on the surface of the silicon substrate 10 for the purpose of contact and interconnection metalization. As a third substep, photopatterning with a metal mask is used to define aluminum contacts 80, 85, 90 and over the source, drain and gate areas 25, 30 and 35.

It will be appreciated that the current line (i) starts at the metal contact 80, through the high conductive area 70, implanted buried source area 41 defined between levels 46 to 47, up through the channel 15, down through the implanted buried drain area 42 defined between levels 46 to 47, up to high conductive areas 75, then through metal contact 90. It will be further appreciated that the distance 100 of 2500 angstroms between the relative top of the implanted buried source area 41 and the bottom of the channel 15, and the distance 105 and 2500 angstroms between the relative top of the implanted buried drain area 42 and the relative bottom of the channel 15 in the Y-coordinate may be precisely controlled by the ion beam and the laser annealing steps thereby distances 100, 105 may be controlled down to VLSI levels of 2500 angstroms or less depending on the parameters of the implants using conventional photopatterning without short-circuiting the buried source or drain areas 41 and 42 defined by implant levels 46 and 47 to the channel areas 15 in relatively much higher yields than possible in the prior art. It will be appreciated that there are no oxidation steps in the present invention which makes for a much simpler process with fewer steps with less time thereby giving a higher yield.

While the presently preferred embodiments of the invention and methods for performing them have been specifically described, it is distinctly understood that the invention may be otherwise variously embodied and used.

What is claimed is:

1. A high speed Schottky barrier field effect transistor with low series resistance, comprising:
    a substrate of one conductivity type;
    a channel layer of the other conductivity type extended downward from a major surface of said substrate;
    a source region of said other conductivity type buried within said substrate below said channel layer;
    a drain region of said other conductivity type buried within said substrate below said channel layer;
    Schottky barrier gate means forming a rectifying junction with a portion of said channel, said gate means providing, when properly biased, control of the current flow between said source region and said drain region;
    said barrier gate means being disposed between said source and drain regions in the horizontal direction, with one edge of said barrier gate means being aligned substantially vertically with an edge of said source region and with another edge of said barrier gate means being aligned substantially vertically with an edge of said drain region; and
    means for providing electrical contact to said source region, said drain region and said gate means, whereby a current flow path from said source region through a portion of said channel and to said drain region can be controllably achieved.

2. A high speed Schottky barrier field effect transistor, with low series resistance, comprising:
    a substrate of one conductivity type;
    a channel layer of the other conductivity type extended downward from a major surface of said substrate;
    a source region of said other conductivity type buried within said substrate below said channel layer;
    a draining region of said other conductivity type buried within said substrate below said channel layer;
    Schottky barrier gate means forming a rectifying junction with a portion of said channel, said gate means providing, when properly biased, control of the current flow between said source region and said drain region;
    said barrier gate means being disposed between said source and drain regions in the horizontal direction, with one edge of said barrier gate means being aligned substantially vertically with an edge of said source region and with another edge of said barrier gate means being aligned substantially vertically with an edge of said drain region;
    means for providing electrical contact to said source region, said drain region and said gate means, whereby a current flow path from said source region through a portion of said channel and to said drain region can be controllably achieved; and
    the distance between the top surfaces of said source and drain regions to the bottom surface of said channel layer each being very small whereby the transistor has low values of source-gate and gate-drain series resistance and, accordingly, said transistor can operate at high frequency.

3. A high speed Schottky barrier field effect transistor, with low series resistance, comprising:
    a substrate of one conductivity type;
    a channel layer of the other conductivity type extended downward from a major surface of said substrate;
    a source region of said other conductivity type buried within said substrate below said channel layer;
    a drain region of said other conductivity type buried within said substrate below said channel layer;
    Schottky barrier gate means forming a rectifying junction with a portion of said channel, said gate means providing, when properly biased, control of the current flow between said source region and said drain region;
    said barrier gate means being disposed between said source and drain regions in the horizontal direction, with one edge of said barrier gate means being aligned substantially vertically with an edge of said source region and with another edge of said barrier gate means being aligned substantially vertically with an edge of said drain region;
    means for providing electrical contact to said source region, said drain region and said gate means, whereby a current flow path from said source region through a portion of said channel and to said drain region can be controllably achieved; and
    the distance between the top surfaces of said source and drain regions to the bottom surface of said channel layer each being no greater than 2500 Angstroms whereby the transistor has low values of source-gate and gate-drain series resistance and, accordingly, said transistor can operate at high frequency.

* * * * *